(12) United States Patent
Elschner et al.

(10) Patent No.: US 8,334,331 B2
(45) Date of Patent: Dec. 18, 2012

(54) POLYTHIOPHENE COMPOSITIONS FOR IMPROVING ORGANIC LIGHT-EMITTING DIODE

(75) Inventors: Andreas Elschner, Mülheim (DE); Knud Reuter, Krefeld (DE); Peter Wilfried Lövenich, Köln (DE)

(73) Assignee: Heraeus Precious Metals GmbH & Co. KG, Hanau (DE)

( * ) Notice: Subject to any disclaimer, the term of this patent is extended or adjusted under 35 U.S.C. 154(b) by 0 days.

(21) Appl. No.: 13/173,547

(22) Filed: Jun. 30, 2011

(65) Prior Publication Data

US 2011/0257277 A1    Oct. 20, 2011

Related U.S. Application Data

(62) Division of application No. 11/054,584, filed on Feb. 9, 2005, now abandoned.

(30) Foreign Application Priority Data

Feb. 10, 2004  (DE) .................. 10 2004 006 583

(51) Int. Cl.
C08K 220/04    (2006.01)
C08J 5/20    (2006.01)

(52) U.S. Cl. .......................... 524/379; 521/28
(58) Field of Classification Search .................. 524/379
See application file for complete search history.

(56) References Cited

U.S. PATENT DOCUMENTS

| | | | |
|---|---|---|---|
| 4,539,507 A | 9/1985 | VanSlyke et al. | |
| 5,111,327 A | 5/1992 | Blohm et al. | |
| 5,150,006 A | 9/1992 | VanSlyke et al. | |
| 5,578,249 A | 11/1996 | Ohtani et al. | |
| 5,965,281 A | 10/1999 | Cao | |
| 5,995,273 A | 11/1999 | Chandrasekhar | |
| 6,206,937 B1 | 3/2001 | Akami et al. | |
| 6,635,729 B1 * | 10/2003 | Groenendaal et al. | 526/256 |
| 2002/0136923 A1 * | 9/2002 | Jonas et al. | 428/690 |
| 2003/0149171 A1 | 8/2003 | Groenendaal et al. | |
| 2004/0044214 A1 | 3/2004 | Andriessen | |
| 2004/0102577 A1 * | 5/2004 | Hsu et al. | 525/182 |

FOREIGN PATENT DOCUMENTS

| | | |
|---|---|---|
| DE | 196 27 071 A1 | 1/1998 |
| DE | 198 41 804 A1 | 3/2002 |
| EP | 0 418 504 | 3/1991 |
| EP | 0 564 911 A2 | 10/1993 |
| EP | 0 686 662 A2 | 12/1995 |
| EP | 0 961 158 | 12/1999 |
| EP | 1 122 274 A1 | 8/2001 |
| EP | 1 227 529 A2 | 7/2002 |
| EP | 1 231 250 | 8/2002 |
| EP | 1 231 251 | 8/2002 |
| EP | 0 991 303 A2 | 4/2005 |
| JP | 2004 085389 | 3/1992 |
| JP | 2001 131150 | 5/2001 |
| JP | 2003 297582 A | 10/2003 |
| JP | 2003297582 A * | 10/2003 |
| JP | 2006 505099 | 2/2006 |
| TW | 555778 | 10/2003 |
| WO | 90 13148 | 11/1990 |
| WO | 98 05187 | 2/1998 |
| WO | 00 65653 | 11/2000 |
| WO | 02 42352 A2 | 3/2002 |
| WO | 03 054052 A1 | 7/2003 |

OTHER PUBLICATIONS

Translation of JP 2003-297582, Oct. 2003.*
Braun, D.; Synthetic Materials, 92: 107-113 (1998).
J. Brandrup et al; solubility Parameter Values; Polymer Handbook, 4th Edition (1999) pp. 688-697, John Wiley & Sons, Inc.
Terje A. Skotheim, Handbook of Conducting Polymers, vol. 1, pp. 45-57; Marcel Dekker, Inc., Aug. 7, 1987.
Olivier Stephan et al; "Electrochemical behaviour of 3,4-ethylenedioxythiophene functionalized by a sulphonate group . . . "; Journal of Electroanalytical Chemistry 443 (1998) pp. 217-226.
Mario Leclerc et al; "Electrical and Optical Properties of Processable Polythiophene Derivatives: Structure-Property Relationships": Advanced Material (1997) 9, No. 14.
Dean M. Welsch et al; "Easily Functionalized 3,4-Ethylenedioxythiophene": Polymer Preprints (1997), vol. 38 (2).
Dirk Hohnholz et al; "Uniform thin films of poly-3,4-ethylenedioxythiophene (EDOT) prepared by in-situ deposition"; Chem. Communi., (2001), pp. 2444-2445.
James R. Sheats et al; "Organic Electroluminescent Devices"; Science, vol. 273, (Aug. 16, 1996), pp. 884-888.
Robert F. Service; "Your (Light-Emitting) Logo Here"; Science, vol. 279, Issue 5354 (Feb. 20, 1998).
Elschner, et al.; "PEDOT, Principles and applications of an intrinsically conductive polymer"; CRC Press (2011) pp. 286-289.

* cited by examiner

*Primary Examiner* — Hui Chin
(74) *Attorney, Agent, or Firm* — Norris McLaughlin & Marcus P.A.

(57) ABSTRACT

The invention relates to compositions which include: (a) a polythiophene containing repeating units represented by the following general formula (I),

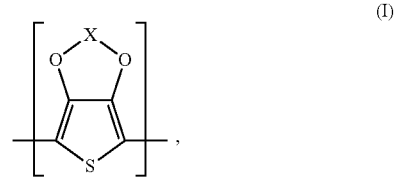

wherein X represents, for example, $-CH_2-CH(CH_2-O-(CH_2)_4SO_3^-H^+)-$; and (b) further polymers, that are different than polythiophene (a), and which contain $SO_3^- M^+$ or $COO^- M^+$ groups. Also disclosed are electroluminescing (EL) arrangements that contain hole-injecting layers which include such compositions.

11 Claims, No Drawings

POLYTHIOPHENE COMPOSITIONS FOR IMPROVING ORGANIC LIGHT-EMITTING DIODE

CROSS REFERENCE TO RELATED PATENT APPLICATION

This application is a division of U.S. application Ser. No. 11/054,584, filed Feb. 9, 2009, pending, which claims foreign priority of German Application No. 10 2004 006 583.7 filed Feb. 10, 2004.

FIELD OF THE INVENTION

The present invention relates to compositions/formulations containing polythiophenes and further polymers, their use, and electroluminescing arrangements containing hole-injecting layers containing these formulations.

BACKGROUND OF THE INVENTION

An electroluminescing arrangement (EL arrangement) is characterised in that when an electrical voltage is applied it emits light accompanied by a flow of current. Such arrangements have been known for a long time under the description "light-emitting diodes") (LEDs). The emission of light is due to the fact that positive charges ("holes") and negative charges ("electrons") recombine with the emission of light.

The LEDs conventionally used in technology all consist to a very large extent of inorganic semiconductor materials. For some years however EL arrangements have been known whose basic constituents are organic materials.

These organic EL arrangements generally contain one or more layers of organic charge transport compounds.

The principal layer structure of an EL arrangement is as follows:
1 Carrier, substrate
2 Base electrode
3 Hole-injecting layer
4 Hole-transporting layer
5 Emitter layer
6 Electron-transporting layer
7 Electron-injecting layer
8 Top electrode
9 Contacts
10 Coating, encapsulation This structure represents the most detailed case and may be simplified by omitting individual layers, so that one layer assumes several tasks. In the simplest case an EL arrangement consists of two electrodes between which is arranged an organic layer that fulfils all functions, including the emission of light.

It has been found in practice however that in order to enhance the light-emitting diode electron-injecting and/or hole-injecting layers in the electroluminescing assemblies are particularly advantageous.

From EP-A 686 662 it is known to use special mixtures of conducting organic polymeric conductors such as poly(3,4-ethylenedioxythiophene) and for example polyhydroxy compounds or lactams as electrode in electroluminescent displays. It has been found in practice however that these electrodes do not have a sufficient conductivity, especially for large area displays. The conductivity is however sufficient for small displays (luminous area <1 cm$^2$).

From DE-A 196 27 071 it is known to use polymeric organic conductors, for example poly(3,4-ethylenedioxythiophene), as hole-injecting layers. The luminosity of the electroluminescing displays can thereby be significantly increased compared to structures that do not employ polymeric organic intermediate layers. The conductivity can be specifically adjusted by reducing the particle size of the poly (3,4-alkylenedioxythiophene) dispersions. In this way it is possible to prevent electrical crosstalk between adjacent address lines, especially in passive matrix displays (EP-A 1 227 529).

The service life of these displays is however still not sufficient for many practical applications.

There therefore existed the need to produce EL arrangements that have, in addition to a high luminosity (luminous intensity), a longer service life, in particular a longer service life at a high luminosity, than known EL arrangements.

SUMMARY OF THE INVENTION

The object of the present invention accordingly consisted in discovering and providing suitable materials for the production of such EL arrangements. A further object consisted in producing such EL arrangements from these materials.

It was surprisingly found that hitherto unknown formulations containing optionally substituted polyanilines or polypyrroles or specially substituted polythiophenes and polymers soluble in polar solvents are outstandingly suitable for producing hole-injecting layers for EL arrangements, and that the resultant EL arrangements have significantly longer service lives than known EL arrangements.

The present invention accordingly provides compositions/formulations comprising at least one optionally substituted polyaniline or polypyrrole or at least one polythiophene containing repeating units of the general formula (I),

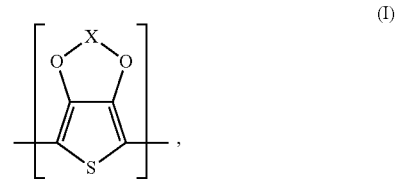

wherein
X denotes —(CH$_2$)$_x$—CR$^1$R$^2$—(CH$_2$)$_y$—, wherein
R$^1$ denotes —(CH$_2$)$_s$—O—(CH$_2$)$_p$—R$^3$,
where
R$^3$ denotes SO$_3^-$H$^+$ or COO$^-$M$^+$, where M$^+$ denotes H$^+$, Na$^+$, K$^+$, Rb$^+$, Cs$^+$ or NH$_4^+$, preferably H$^+$, Na$^+$ or K$^+$, particularly preferably H$^+$,
s is an integer from 0 to 10, preferably 0 to 3, particularly preferably 0 or 1, and
p is an integer from 1 to 18, preferably 2 to 6, particularly preferably 3, 4 or 5,
or denotes —(CH$_2$)$_q$—O(CH$_2$CH$_2$O)$_r$R$^4$,
wherein
R$^4$ denotes optionally substituted C$_1$-C$_4$-alkyl,
q denotes an integer from 0 to 10, and
r denotes an integer from 1 to 12, preferably 2, 3 or 4,
R$^2$ independently of R$^1$ denotes H, a linear or branched optionally substituted C$_1$-C$_{20}$-alkyl radical, a C$_6$-C$_{14}$-aryl radical or —(CH$_2$)$_s$—O—(CH$_2$)$_p$R$^3$ or —(CH$_2$)$_q$—O (CH$_2$CH$_2$O)$_r$R$^4$,
where R$^3$, s, p, R$^4$, q and r have the meanings given for R$^1$,
an
x, y in each case independently of one another denote an integer from 0 to 9, preferably 0 to 3, particularly preferably 0, 1 or 2, and at least one further polymer containing $SO_3^-M^+$ or $COO^-M^+$ groups, where $M^+$ denotes $H^+$, $Li^+$, $Na^+$, $K^+$, $Rb^+$, $Cs^+$ or $NH^+$, preferably $H^+$, $Na^+$ or $K^+$, particularly preferably $H^+$.

Here and below the term substituted means if not otherwise indicated a substitution with chemical group selected from the group consisting of:

alkyl, in particular $C_1$-$C_{20}$-alkyl, cycloalkyl, in particular $C_3$-$C_{20}$-cycloalkyl, aryl, in particular $C_6$-$C_{14}$-aryl, halogen, in particular Cl, Br, J, ether, thioether, disulfide, sulfoxide, sulfone, amino, aldehyde, keto, carboxylic acid ester, cyano, alkylsilane and alkoxysilane groups as well as carboxylamide groups.

Unless otherwise indicated, all numbers or expressions, such as those expressing quantities of ingredients, process conditions, etc., used in the specification and claims are understood as modified in all instances by the term "about."

DETAILED DESCRIPTION OF THE INVENTION

The repeating units of the general formula (I) may be identical or different within a polythiophene. Preferred are repeating units of the general formulae (I-a) and/or (I-b),

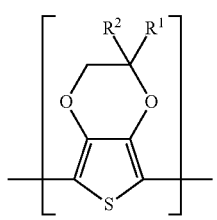

(I-a)

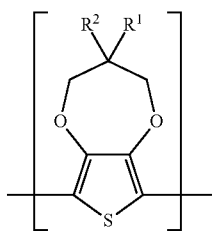

(I-b)

wherein $R^1$ and $R^2$ have the meanings given hereinbefore for the general formula (I).

Preferred embodiments of the present invention are such formulations containing at least one polythiophene containing repeating units of the formulae (I-a-1) and/or (I-b-1) and/or (I-a-2) and/or (I-b-2)

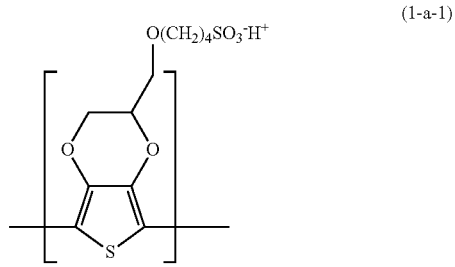

(1-a-1)

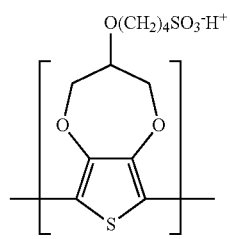

(I-b-1)

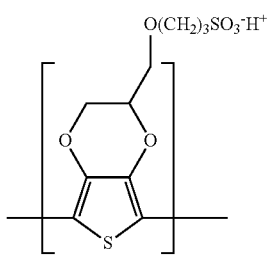

(I-a-2)

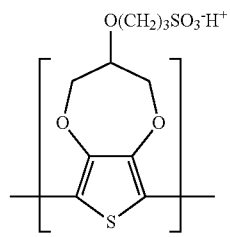

(I-b-2)

In the case where repeating units of the general formulae (I-a) and/or (I-b) and/or (I-a-1) and/or (I-b-1) and/or (1-a-2) and/or (I-b-2) are contained in the polythiophene, the radicals $R^1$ may in each case be identical or different and the radicals $R^2$ may in each case be identical or different, though preferably the radicals $R^1$ are in each case identical and the radicals $R^2$ are in each case identical.

The polythiophene may be built up from repeating units of the general formula (I-a), (I-a-1) and/or (I-a-2) or from repeating units of the general formula (I-b), (I-b-1) and/or (I-b-2) or also from repeating units of the general formula (I-a) and (I-b), (I-a-1) and (I-b-1) and/or (I-a-2) and (I-b-2). In the last-mentioned case the units of the general formula (I-a) and (I-b), (I-a-1) and (I-b-1) and/or (I-a-2) and (I-b-2) may be contained in arbitrary proportions in the polythiophene, though preferably the units of the general formula (I-a), (I-a-1) and/or (I-a-2) are contained in a proportion of 65 to 99.5%, particularly preferably in a-proportion of 75 to 99% and most particularly preferably in a proportion of 75 to 85%, referred to the total content of repeating units in the polythiophene, and the units of the general formula (I-b), (I-b-1) and/or (I-b-2) are contained preferably in a proportion of 0.5 to 35%, particularly preferably in a proportion of 1 to 25% and most particularly preferably in a proportion of 15 to 25%, referred to the total number of repeating units in the polythiophene, with the proviso that the sum total of both proportions is 100%.

The polythiophene may however contain, in addition to the repeating units of the general formula (I), (I-a) and/or (I-b), (I-a-1) and/or (I-b-1) and/or (I-a-2) and/or (I-b-2), also other repeating units, for example repeating units of the general formulae (II) and/or (III),

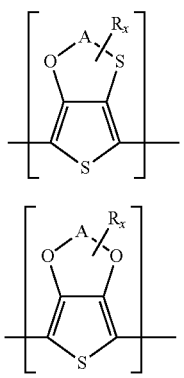

(II)

(III)

wherein

A denotes an optionally substituted $C_1$-$C_5$-alkyl radical,

R denotes a linear or branched, optionally substituted $C_1$-$C_{18}$-alkyl radical, an optionally substituted $C_5$-$C_{12}$-cycloalkyl radical, an optionally substituted $C_6$-$C_{14}$-aryl radical, an optionally substituted $C_7$-$C_{18}$-aralkyl radical, an optionally substituted $C_1$-$C_4$-hydroxyalkyl radical or an hydroxyl radical, x denotes an integer from 0 to 8, and in the case where several radicals R are bonded to A, these may be identical or different.

As optional further substituents of the radical R, numerous organic groups are suitable, for example alkyl, cycloalkyl, aryl, halogen, ether, thioether, disulfide, sulfoxide, sulfone, amino, aldehyde, keto, carboxylic acid ester, cyano, akylsilane and alkoxysilane groups as well as carboxylamide groups.

The polythiophene may contain, apart from the repeating units of the general formula (I), (I-a) and/or (I-b), (I-a-1) and/or (I-b-1) and/or (I-a-2) and/or (I-b-2), preferably also repeating units of the formula (IIIa), (3,4-ethylenedioxythiophene units)

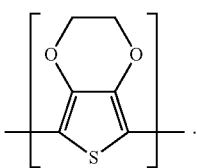

(III-a)

In preferred embodiments of the formulations according to the invention $R^2$ in the repeating units of the general formula (I), (I-a) and/or (I-b) denotes H.

In further preferred embodiments of the formulations according to the invention $R^3$ in the repeating units of the general formula (I), (I-a) and/or (I-b) denotes $SO_3^-M^+$, where $M^+$ has the meaning mentioned hereinbefore for the general formula (I).

In the case where the polythiophenes are copolymers of two or more different repeating units of the general formula (I)—here and hereinafter this is also understood to denote units of the general formulae (I-a) and/or (I-b) or (I-a-1) and/or (I-b-1) or (1-a-2) and/or (I-b-2)—or repeating units of the general formula (I) and (II) and/or (III)—here and hereinafter also understood to include units of the general formulae (III-a)—the repeating units may be contained randomly, alternatingly or as blocks in the copolymer.

Both in the copolymers containing repeating units of the general formula (I) and optionally further repeating units of the general formulae (II) and/or (III) and also in the homopolymers containing repeating units of the general formula (I), the coupling of the repeating units may be regioregular and/or non-regioregular.

The repeating units of the general formulae (II) and/or (III), preferably of the formula (III-a), in a copolymer comprising structural units of formulae (I) and (II) and/or (III) are contained in the copolymers preferably in a proportion of at most 50%, particularly preferably of at most 30%, referred to the total number of the repeating units in the copolymer. The repeating units of the general formula (I) are contained in the copolymers in a proportion of at least 50%, preferably in a proportion of at least 70%, referred to the total number of the repeating units. In this connection repeating units of the general formula (I-a) or (I-b) or (I-a) and (I-b) may be contained. Repeating units of the general formula (I-a) and (I-b) may be contained in arbitrary mixture ratios. Preferably repeating units of the general formula (I-a) are contained in a proportion of 65 to 100%, particularly preferably in a proportion of 75 to 99%, most particularly preferably in a proportion of 75 to 85%, referred to the total number of the repeating units of the general formula (I), and the repeating units of the general formula (I-b) are contained in a proportion of 0 to 35%, particularly preferably in a proportion of 1 to 25% and most particularly preferably in a proportion of 15 to 25%, referred to the total number of the repeating units of the general formula (I) in the copolymers, with the proviso that the sum total of both proportions is 100%.

The polythiophenes preferably carry in each case H on the terminal groups. The polythiophenes contain in total n repeating units of the general formula (I) and optionally of the general formulae (II) and/or (III), where n is an integer from 2 to 1000, preferably 3 to 100, particularly preferably 4 to 15.

Repeating units are understood within the context of the invention to denote units of the general formulae (I), (II) or (III), irrespective of whether they are contained once or more than once in the polythiophene. In other words, units of the general formulae (I), (II) or (III) are also understood to be repeating units even if they are contained only once in the polythiophene.

Formulations according to the invention may also include those that contain, apart from at least one of the polythiophenes described hereinbefore containing repeating units of the general formula (I), also further conducting polymers, such as for example polyanilines or polypyrroles.

The production of the polythiophenes described hereinbefore containing repeating units of the general formula (I) is described in principle in EP-A 1 122 274 or U.S. Pat. No. 5,111,327.

The polymerisation of the corresponding monomeric compounds usually is carried out with suitable oxidising agents in suitable solvents. Examples of suitable oxidising agents are iron(III) salts, in particular $FeCl_3$ and iron(III) salts of aromatic and aliphatic sulfonic acids, $H_2O_2$, $K_2Cr_2O_7$, $K_2S_2O_8$, $Na_2S_2O_8$, $KMnO_4$, alkali metal perborates and alkali metal or ammonium persulfates or mixtures of these oxidising agents. Further suitable oxidising agents are described for example in "Handbook of Conducting Polymers" (Ed. Skotheim, T. A.), Marcel Dekker: New York, 1986, Vol. 1, 46-57. Particularly preferred oxidising agents are $FeCl_3$, $Na_2S_2O_8$ and $K_2S_2O_8$ or mixtures thereof. The polymerisation is preferably carried out at a reaction temperature of −20° to 100° C. Particularly preferred are reaction temperatures of 20° to 100° C. The reaction solution is then optionally treated with at least one ion exchanger.

Suitable solvents are for example polar solvents such as for example water, alcohols such as methanol, ethanol, 2-propanol, n-propanol, n-butanol, diacetone alcohol, ethylene glycol, glycerol or mixtures of these. Also suitable are aliphatic ketones such as acetone and methyl ethyl ketone, aliphatic nitriles such as acetonitrile, aliphatic and cyclic amides such as N,N-dimethylacetamide, N,N-dimethylformamide (DMF) and 1-methyl-2-pyrrolidone (NMP), ethers such as tetrahydrofuran (THF) as well as sulfoxides such as dimethyl sulfoxide (DMSO) or mixture of these solvents with one another or with the previously specified solvents.

The corresponding monomeric compounds for the production of polythiophenes containing repeating units of the general formula (I) are known. Their production is described for example in Chevrot et al., *J Electroanal. Chem.* 1998, 443, 217-226, Leclerc et al., *Adv. Mater.* 1997, 9, 1087-1094 and Reynolds et al., *Polymer Preprints* 1997, 38 (2), 320.

The resulting polythiophenes are readily soluble in the polar solvents or solvent mixtures.

The formulations according to the invention contain at least one further polymer containing $SO_3^-M^+$ or $COO^-M^+$ groups. Suitable polymers within the scope of the invention containing $SO_3^-M^+$ or $COO^-M^+$ groups are preferably those that do not contain a completely conjugated main chain, hereinafter also briefly termed non-conjugated. Preferably these polymers are soluble in polar solvents such as water, alcohols such as methanol, ethanol, 2-propanol, n-propanol, n-butanol, diacetone alcohol, ethylene glycol, glycerol, aliphatic ketones such as acetone and methyl ethyl ketone, aliphatic nitriles such as acetonitrile, aliphatic and cyclic amides such as N,N-dimethylacetamide, N,N-dimethylformamide (DMF) and 1-methyl-2-pyrrolidone (NMP), ethers such as tetrahydrofuran (THF) as well as sulfoxides such as dimethyl sulfoxide (DMSO) or mixtures containing these, preferably in water, alcohols such as methanol, ethanol, 2-propanol, n-propanol and n-butanol or mixtures thereof.

Suitable polymers containing $SO_3^-M^+$ or $COO^-M^+$ groups that may be mentioned by way of example are polymeric carboxylic acids such as polyacrylic acids, polymethacrylic acid or polymaleic acids, or polymeric sulfonic acids such as polystyrenesulfonic acids and polyvinylsulfonic acids. Also suitable are copolymers of vinylcarboxylic and vinylsulfonic acids with other polymerisable monomers such as acrylic acid esters and styrene, or polymers containing partially fluorinated or perfluorinated $SO_3^-M^+$ or $COO^-M^+$ groups. Particularly suitable are polystyrenesulfonic acid, poly(styrenesulfonic co-maleic acid), poly(vinylsulfonic acid) or commercially obtainable polymers that contain sulfonic acid groups and $CF_2$ groups, such as for example Nafion®, (copolymer of tetrafluoroethylene and of the fluorovinylether of poly(hexafluoro propylene oxide)mono(tetrafluoro vinyl sulfonic acid)ethers).

In preferred embodiments the formulation according to the invention contains as at least one polymer containing $SO_3^-M^+$ or $COO^-M^+$ groups, a partially fluorinated or perfluorinated polymer containing $SO_3^-M^+$ or $COO^-M^+$ groups.

Such polymers containing partially fluorinated or perfluorinated $SO_3^-M^+$ or $COO^-M^+$ groups are for example those containing repeating units of the formulae (IV-a) and (IV-b),

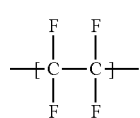
(IV-a)

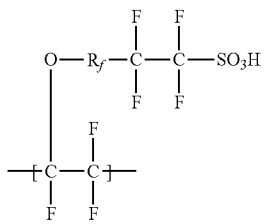
(IV-b)

wherein $R_f$ denotes a radical with at least one, preferably 1 to 30, repeating unit(s) of the formula (IV-c)

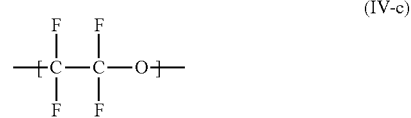
(IV-c)

Such perfluorinated polymers are for example the polymers obtainable commercially under the trade name Nafion® or in dissolved form under the trade name Liquion®.

In particularly preferred embodiments the formulation according to the invention contains Nafion® (copolymer of tetrafluoroethylene and of the fluorovinylether of poly (hexafluoro propylene oxide)mono(tetrafluoro vinyl sulfonic acid)ethers) as at least one polymer containing $SO_3^-M^+$ or $COO^-M^+$ groups.

In further preferred embodiments the formulation according to the invention contains at least two polymers containing $SO_3^-M^+$ or $COO^-M^+$ groups. In a particularly preferred embodiment the formulation according to the invention contains copolymers of tetrafluroethylene and sulfonic acid or carboxyl functional perfluorinated ethylene (e.g., Nafion® PFSA polymers) and polystyrenesulfonic acid (PSS) as polymers containing $SO_3^-M^+$ or $COO^-M^+$ groups.

The molecular weight of the polyacids is preferably 1,000 to 2,000,000, particularly preferably 2,000 to 500,000. The polyacids or their alkali metal salts are commercially available, for example polystyrenesulfonic acids and polyacrylic acids, or may however also be produced by known processes (see for example Houben Weyl, Methoden der organischen Chemie, Vol. E 20 Makromolekulare Stoffe, Part 2, (1987), p. 1141 ff.).

The formulations according to the invention contain, referred to one part by weight of polythiophene(s) containing repeating units of the general formula (I), preferably 1 to 30 parts by weight, particularly preferably 2 to 15 parts by weight of the polymer or polymers containing $SO_3^-M^+$ or $COO^-M^+$ groups. Most particularly preferably the formulations according to the invention contain the polythiophene or polythiophenes containing repeating units of the general formula (I) and the polymer or polymers containing $SO_3^-M^+$ or $COO^-M^+$ groups, in a weight ratio of polythiophene(s) to polymer(s) containing $SO_3^-M^+$ or $COO^-M^+$ groups of 1 to 2 (1:2) to 1 to 15 (1:15), in particular 1 to 3 (1:3) to 1 to 15 (1:15).

This ratio of polythiophene(s) to polymer(s) containing $SO_3^-M^+$ or $COO^-M^+$ groups may be adjusted directly by mixing the two components.

Furthermore the formulations according to the invention may preferably contain at least one polar diluent. Polar diluents (solvents) within the scope of the invention are understood to mean diluents with a solubility parameter δ of 16

MPa$^{1/2}$ and above, preferably 19 MPa$^{1/2}$ and above. The measurement of solubility parameters as a rule takes place at standard temperature (20° C.). For the measurement and calculation of solubility parameters, see J. Brandrup et al., Polymer Handbook, 4$^{th}$ Edition, 1999, VII/675-VII/688. Solubility parameters are tabulated, for example in J. Brandrup et al., Polymer Handbook, 4$^{th}$ Edition, 1999, VII/688-VII/697. Preferred polar diluents are water, alcohols such as methanol, ethanol, 2-propanol, n-propanol, n-butanol, diacetone alcohol, ethylene glycol, glycerol, aliphatic ketones such as acetone and methyl ethyl ketone, aliphatic nitriles such as acetonitrile, aliphatic and cyclic amides such as N,N-dimethylacetamide, N,N-dimethylformamide (DMF) and 1-methyl-2-pyrrolidone (NMP), ethers such as tetrahydrofuran (THF) as well as sulfoxides such as dimethyl sulfoxide (DMSO) or mixtures containing these. Particularly preferred polar solvents are water, alcohols or mixtures containing these, most particularly preferred being water, methanol, ethanol, n-propanol, 2-propanol or n-butanol or mixtures containing these.

Such new formulations containing at least one polar diluent preferably contain 99.99 to 80 wt. %, particularly preferably 99.8 to 95 wt. % of polar diluent(s) and have a solids content of 0.01 to 20 wt. %, particularly preferably 0.2 to 5 wt. %, i.e. they contain in total 0.01 to 20 wt. %, particularly preferably 0.2 to 5 wt. % of polythiophene(s), polymer(s) containing $SO_3^-M^+$ or $COO^-M^+$ groups, and optionally further components such as e.g. binders, crosslinking agents and/or surfactants in dissolved and/or dispersed form.

The viscosity at 20° C. of the new formulations containing at least one polar diluent is typically between the viscosity of the diluent and 200 mPas, preferably <100 mPas.

In order to adjust the desired solids content and the necessary viscosity, the desired amount of diluent can be removed from the formulations by distillation, preferably in vacuo, or by other methods, e.g. filtration.

Organic, polymeric binders and/or organic, low molecular weight crosslinking agents or surfactants may also be added to the formulations according to the invention. Suitable binders are described for example in EP-A 564 911. By way of example there may be mentioned polyvinylcarbazole, silanes such as Silquest® A187 (OSi specialities) or surfactants such as the fluorinated surfactant FT 248 (Bayer AG, tetraethylammonium salt of perfluoro octyl sulfonic acid).

The formulations preferably contain only minor amounts of ionic impurities within the limits as described in EP-A 991 303. Preferably the formulations contain less than 1000 ppm of ionic impurities.

The formulations according to the invention may be produced in various ways. For example, it is possible to mix at least one polythiophene with at least one polymer containing $SO_3^-M^+$ or $COO^-M^+$ groups and optionally add at least one diluent to this mixture, and preferably dissolve it completely or partially in at least one diluent. It is also possible to dissolve at least one polythiophene beforehand in at least one diluent and to dissolve at least one polymer containing $SO_3^-M^+$ or $COO^-M^+$ groups beforehand in at least one diluent and then to mix the two solutions. The diluent or diluents may then optionally be completely or partially removed from this mixture, for example by distillation or by other methods. There also exists the possibility of producing the formulations according to the invention by first of all producing the polythiophene or polythiophenes by polymerisation of the corresponding monomeric compounds with at least one suitable oxidising agent in at least one suitable solvent, wherein either the solvent corresponds to one of the polar diluents listed hereinbefore or an appropriate exchange of solvent or addition of further solvents may take place after completion of the polymerisation. At least one polymer containing $SO_3^-M^+$ or $COO^-M^+$ groups—optionally likewise dissolved in at least one diluent—may then be mixed with the polythiophene solution and added to this solution. The diluent or diluents may then optionally be removed completely or partially from this mixture.

Surprisingly the formulations according to the invention are outstandingly suitable for the production of hole-injecting or hole-transporting layers in EL arrangements, organic solar cells, organic laser diodes, organic thin film transistors or organic field effect transistors, and for the production of electrodes or electrically conducting coatings.

The present invention accordingly also provides for the use of the formulations according to the invention for the production of hole-injecting layers in EL arrangements, and for the production of electrodes or electrically conducting coatings.

In particular EL arrangements with a hole-injecting layer containing a formulation according to the invention are characterised by a high luminosity (luminous intensity) and a significantly longer service life than known EL arrangements.

The present invention accordingly also provides EL arrangements comprising a hole-injecting layer on the basis of a formulation according to the invention. Preferred are those EL arrangements comprising at least two electrodes, at least one of which is optionally mounted on an optionally transparent substrate, at least one emitter layer between the two electrodes and at least one hole-injecting layer between one of the two electrodes and the emitter layer, characterised in that the hole-injecting layer contains a formulation according to the invention.

In the production of many large-area EL arrangements, for example large-area electroluminescing display elements, it is advantageous if at least one of the current-conducting electrodes consists of a transparent and conducting material.

Suitable as such transparent and conducting electrode materials are for example
a) metal oxides, e.g. indium-tin oxide (ITO), tin oxide (NESA), doped tin oxide, doped zinc oxide, etc.,
b) semi-transparent metals films, e.g. Au, Pt, Ag, Cu etc.,
c) semi-transparent, conducting polymers, e.g. polythiophenes, polyanilines, polypyrroles, etc.

In the case of an electrode that does not consist of one of the transparent and conducting materials listed hereinbefore, then it is preferably a metal electrode, in particular a metal cathode.

Suitable materials for metal cathodes are those commonly used for electrooptical structures and known to the person skilled in the art. Suitable as metal cathodes are preferably those of metals with a low work function such as Mg, Ca, Ba or metal salts such as LiF.

Suitable as optionally transparent substrate are for example glass, very thin glass (flexible glass) or plastics, preferably plastics films.

Particularly suitable plastics are: polycarbonates, polyesters such as e.g. PET and PEN (polyethylene terephthalate and polyethylene naphthalenedicarboxylate), copolycarbonates, polyacrylate, polysulfone, polyether sulfone (PES), polyimide, polyethylene, polypropylene or cyclic polyolefins and cyclic olefin copolymers (COC), hydrogenated styrene polymers or hydrogenated styrene copolymers.

Suitable polymer substrates may for example be films such as polyester films, PES films from Sumitomo, or polycarbonate films from Bayer AG (Makrofol®).

A bonding agent layer may be arranged between the substrate and the electrode. Suitable bonding agents are for example silanes. Preferred are epoxysilanes, such as for example 3-glycidoxypropyltrimethoxysilane (Silquest® A187, OSi specialities). Other bonding agents with hydrophilic surface properties may also be used. Thus, for example, a thin layer of PEDT:PSS is described as a suitable bonding agent for PEDT (Hohnholz et al., Chem. Commun. 2001, 2444-2445).

The emitter layer of the EL arrangement according to the invention contains at least one emitter material. Suitable emitter materials are those commonly used for electrooptical structures and known to the person skilled in the art. Suitable emitter materials are preferably conjugated polymers such as polyphenylenevinylenes and/or polyfluorenes, such as the polyparaphenylenevinylene derivatives and polyfluorene derivatives described for example in WO-A 90/13148, or emitters from the class of low molecular weight emitters, also termed "small molecules" in specialist circles, such as aluminium complexes, e.g. tris(8-hydroxy-quinolinato)aluminium ($Alq_3$), fluorescing dyes, e.g. quinacridones, or phosphorescing emitters, e.g. $Ir(ppy)_3$. Emitter materials are described for example in DE-A 196 27 071.

In addition to the layers listed hereinbefore, further functional layers may be contained in such an electroluminescing layer structure (EL arrangement), such as for example further charge-injecting, e.g. electron-injecting, charge-transporting or charge-blocking intermediate layers. Such layer composites are known to the person skilled in the art and are described for example in J. R. Sheats et al., Science 273, (1996), 884. A layer may also perform several tasks. For example, the emitter materials listed hereinbefore may be used in combination with a hole-transporting intermediate layer between the hole-injecting and emitter layer (cf. e.g. U.S. Pat. No. 4,539,507 and U.S. Pat. No. 5,150,006).

The basic production of such EL arrangements is known to the person skilled in the art. They may be produced for example by applying an electrode from solution or by vapour deposition on a substrate. For example, metal oxide electrodes or semi-transparent metal film electrodes are preferably applied by vapour deposition, whereas semi-transparent, conducting polymer electrodes are preferably applied from solution to the substrate. A bonding agent may optionally be applied—by vapour deposition or from solution—before application of the electrode material to the substrate. Some examples of substrates coated with electrode material are also already commercially obtainable (e.g. K-Glas, ITO-coated glass substrates). The hole-injecting layer may then be applied to the electrode, which advantageously takes place from solution in the case of the EL arrangements according to the invention with a hole-injecting layer containing a formulation according to the invention. The further layers are then applied from solution or by vapour deposition, depending on the material used, to the hole-injecting layer in the order specified in the introduction, bearing in mind that individual layers may be omitted. The layer arrangement is then contacted and encapsulated.

The production of the hole-injecting layer containing a formulation according to the invention is carried out according to known techniques. For this, a formulation according to the invention—optionally in a solvent—is applied as a film to an electrode, preferably the base electrode. Suitable solvents are the polar diluents specified above, preferably water, alcohols or mixtures of the latter. Suitable alcohols are for example methanol, ethanol, n-propanol, 2-propanol and n-butanol.

The use of these solvents has the advantage that further layers may be applied from organic solvents such as aromatic or aliphatic hydrocarbon mixtures without the hole-injecting layer being attacked.

The formulation according to the invention—optionally in a solvent—may be uniformly distributed on the electrode by techniques such as spin coating, casting, knife application, pressure application, curtain casting, etc. The layers may then be dried at room temperature or temperatures of up to 300° C., preferably 100° to 200° C.

The formulation according to the invention—optionally in a solvent—may also preferably be applied in a structured manner by techniques such as ink-jet application. This technique is known to the person skilled in the art and is described, with the use of water-soluble and dispersed polythiophenes such as 3,4-polyethylenedioxythiophene:polystyrenesulfonic acid (PEDT:PSS), for example in Science, Vol. 279, 1135, 1998 and DE-A 198 41 804.

Preferably the formulations according to the invention—optionally in a solvent—are filtered through a filter before the application.

Formulations that can be filtered particularly well are for example obtained if, referred to one part by weight of polythiophene(s) containing repeating units of the general formula (I), there are preferably used 1 to 30 parts by weight, particularly preferably 2 to 15 parts by weight of the polymer (s) containing $SO_3^-M^+$ or $COO^-M^+$ groups, and most particularly preferably the formulations according to the invention contain the polythiophene(s) containing repeating units of the general formula (I) and the polymer(s) containing $SO_3^-M^+$ or $COO^-M^+$ groups, in a weight ratio of polythiophene(s) to polymer(s) containing $SO_3^-M^+$ or $COO^-M^+$ groups of 1 to 2 to 1 to 15.

The thickness of the hole-injecting layer is for example 3 to 500 nm, preferably 10 to 200 nm.

The influence of a hole-injecting layer containing a formulation according to the invention on the properties of the EL arrangement may be tested in a special assembly of such an EL arrangement according to the invention. For this, the hole-injecting layer is applied by means of a spin coater to a wet chemically cleaned ITO substrate. The layer is then dried at 100°-200° C. for 5 minutes. The layer thickness is 20-300 nm. Depending on the spinning speed, a 1 wt. % solution of a polyfluorene-based emitter material (Green 1300 LUMATION™ from Dow Chemical Company) in xylene is spin centrifuged as emitter layer. The thickness of the emitter layer is typically 60-120 nm. Finally, as cathode a 5 nm thick Ba layer is vapour deposited and a 200 nm thick Ag layer is then vapour deposited thereon. By contacting the indium/tin oxide (ITO) anode and the metal cathode, current/voltage/luminous flux density characteristic lines are recorded by means of a characteristic line recorder and a calibrated photodiode and the service lives are measured. For this, a constant electric current or an alternating current is passed through the arrangement and the voltage and the luminous flux density are followed over time.

The organic light-emitting diodes according to the invention are characterised by a long service life, high luminosity, low applied voltages and a high rectification ratio. Compared to known light-emitting diodes with hole-injecting layers produced from a poly(3,4-ethylenedioxythiophene):polystyrenesulfonic acid (PEDT:PSS) dispersion (Baytron® P, H.C. Starck GmbH), it was surprisingly found that the service lives of organic light-emitting diodes according to the invention with a hole-injecting layer containing a formulation according to the invention are significantly longer.

EXAMPLES

Example 1

Production of a polymer containing 4-(2,3-dihydrothieno[3,4-b][1,4]dioxin-2-ylmethoxy)-1-butanesulfonic acid) repeating units and 4-(3,4-dihydro-2H-thieno[3,4-b][1,4]dioxepin-3-yl)-1-butanesulfonic acid) repeating units (PEDT-S)

17.5 g of EDT-S (mixture of 80% of 4-(2,3-dihydrothieno[3,4-b][1,4]dioxin-2-ylmethoxy)-1-butanesulfonic acid and 20% of 4-(3,4-dihydro-2H-thieno[3,4-b][1,4]dioxepin-3-yl)-1-butanesulfonic acid) as sodium salt were dissolved in 350 ml of water under a protective gas atmosphere ($N_2$). 25.6 g of $FeCl_3$ were then added. The solution was next stirred for 2 hours at room temperature (=RT, 23° C.), then heated at 100° C. for 12 hours, and worked up after cooling to RT. For this, the solution was diluted with water to ca. 3 wt. % and deionised with 66 g each of Lewatit® S 100 (cation exchanger from Bayer Chemicals AG) and Lewatit® MP 62 (anion exchanger from Bayer Chemicals AG) by stirring for 4 hours at 23° C. This procedure was repeated a further three times.
Solids content: 1.45 wt. %
Iron content: 1.7 ppm
Sodium content: 32 ppm
Sulfate content: 15 ppm
Chloride content: <10 ppm The sodium salt of the EDT-S used was prepared from Baytron® M OH VP CH 8020 (mixture of 80% of 2,3-dihydrothieno[3,4-b][1,4]dioxin-2-yl-methanol and 20% of 3,4-dihydro-2H-thieno-[3,4-b][1,4]dioxepin-3-ol, H.C. Starck GmbH) similarly to the procedure described by Chevrot et al., J. Electroanal. Chem. 1998, 443, pp. 217-226. According to $^1$H-NMR analysis in $D_2O$ the product consists of 80% of 4-(2,3-dihydrothieno[3,4-b][1,4]dioxin-2-ylmethoxy)-1-butanesulfonic acid and 20% of 4-(3,4-dihydro-2H-thieno[3,4-b][1,4]dioxepin-3-yl)-1-butanesulfonic acid, in each case as the sodium salt.

Example 2.1

20 g of the PEDT-S solution prepared according to Example 1 with a solids content of 1.45 wt. % are mixed with 36.4 g of a 4.78 wt. % solution of Nafion® in a mixture of lower aliphatic alcohols and water (Nafion® perfluorinated ion-exchange resin, 5 wt % solution in lower aliphatic alcohols/$H_2O$", CAS-No. 66796-30-3, Aldrich Order No. 27,470-4, measured solids content 4.78 wt. %). The weight ratio of PEDT-S to Nafion® is in this solution 1:6.

Example 2.2

20 g of the PEDT-S solution prepared according to Example 1 with a solids content of 1.45 wt. % are mixed with 15.17 g of a 4.78 wt. % solution of Nafion® in a mixture of lower aliphatic alcohols and water (Nafion® perfluorinated ion-exchange resin, 5 wt % solution in lower aliphatic alcohols/$H_2O$", CAS-No. 66796-30-3, Aldrich Order No. 27,470-4, measured solids content 4.78 wt. %). The weight ratio of PEDT-S to Nafion® is in this solution 1:2.5.

Example 2.3

The PEDT-S solution from Example 1 is mixed with different amounts of a solution of polystyrenesulfonic acid (PSS) in $H_2O$ (HAPPS VP AI 4061, solids content 5.88 wt. %, H.C. Starck GmbH).

| Weight Ratio PEDT-S:PSS | Composition of the Solution for Stage 2 |
|---|---|
| 1:1 | 21.1 g of PEDT-S solution with 1.45 wt. % solids content, 5.2 g of PSS solution with 5.88 wt. % solids content, |
| 1:2.5 | 10.55 g of PEDT-S solution with 1.45 wt. % solids content, 6.37 g of PSS solution with 5.88 wt. % solids content, |
| 1:6 | 10.55 g of PEDT-S solution with 1.45 wt. % solids content, 15.61 g of PSS solution with 5.88 wt. % solids content, |

Example 3

The formulation according to the invention from Example 2.1 is used to construct an organic light-emitting diode (OLED). The following procedure is adopted in the production of the OLED:

1. Cleaning of the ITO-Coated Substrate

ITO-coated glass (Merck Balzers AG, FL, Part. No. 253 674 XO) is cut into 50 mm×50 mm size pieces (substrates). The substrates are then cleaned in a 3% aqueous mucasol solution in an ultrasound bath for 15 minutes. Following this the substrates are rinsed with distilled water and spin-dried in a centrifuge. This rinsing and drying procedure is repeated 10 times. The ITO-coated sides are cleaned for 10 minutes in a UV/ozone reactor (PR-100, UVP Inc., Cambridge, GB) immediately before the coating.

2. Application of the Hole-Injecting Layer

About 10 ml of the mixture according to the invention from Example 2.1 are filtered (Millipore HV, 0.45 μm). The cleaned ITO-coated substrate is placed on a paint application centrifuge and the filtered solution is distributed on the ITO-coated side of the substrate. The supernatant solution is then spun off by rotating the plate at 1200 rpm for a period of 30 seconds. Following this the coated substrate is dried for 5 minutes at 200° C. on a hotplate. The layer thickness is 85 nm (Tencor, Alphastep 500).

3. Application of the Emitter Layer 5 ml of a 1 wt. % xylene solution of the emitter Green 1300 LUMATION™ (Dow Chemical Company) are filtered (Millipore HV, 0.45 μm) and distributed on the dried, hole-injecting layer. This and all further process steps are carried out in an atmosphere of pure nitrogen (inert gas-glove box system, M. Braun, Garching). The hole-injection layer is post-dried beforehand in the glove box for a further 5 minutes at 200° C. The supernatant solution of the emitter is then spun off by rotating the plate at 400 rpm for 30 seconds. Following this the coated substrate is dried for 15 minutes at 130° C. on a hotplate. The total layer thickness is 185 nm.

4. Application of the Metal Cathode

A metal cathode is vapour deposited on the emitter layer. The substrate is placed together with the emitter layer downwards on a perforated mask (hole diameter 2.5 mm). A 5 nm thick Ba layer and a 200 nm thick Ag layer are vapour deposited in succession from two vapour deposition boats at a pressure of $p=10^{-3}$ Pa. The vapour deposition rates are 10 Å/sec for Ba and 20 Å/sec for Ag.

5. Characterisation of the OLED

The two electrodes of the organic LED are connected (contacted) via electrical leads to a voltage source. The positive pole, is connected to the ITO electrode and the negative pole to the metal electrode. The dependence of the OLED current and elecroluminescence intensity (detection by means of a photodiode (EG&G C30809E) on the voltage are recorded. The service lives are then determined by passing a constant current I=0.39 mA (8 mA/cm²) through the arrangement and following the voltage and light intensity over time. All OLED characterisations are carried out in the glove box under inert conditions.

Comparison Example 3.1

Production of an OLED with polyethylenedioxythiophene/polystyrenesulfonic acid as Hole-Injecting Layer:

The procedure is carried out as in Example 3, with the following variation in process step 2:
2. Application of the Hole-Injection Layer About 10 ml of a 1.3% polyethylenedioxythiophene/polystyrenesulfonic acid solution (Baytron®P, TP AI 4083; manufacturer H.C. Starck GmbH), which had been desalted beforehand by column chromatography, were filtered (Millipore HV, 0.45 μm). The ITO-coated substrate is then placed on a paint application centrifuge and the filtered solution is distributed over the ITO-coated side of the substrate. The supernatant solution is then spun off by rotating the plate at 1500 rpm over a period of 30 seconds. Following this the coated substrate is dried for 5 minutes at 200° C. on a hotplate. The layer thickness is 85 nm.

The application of the metal cathodes according to process step 4 was carried out jointly with the layer structures from Example 3, in order to ensure comparability.

Results of the characterision of the OLEDs from Example 3 and Comparison Example 3.1:

|  | t = 0 | | t = 800 hours | |
| --- | --- | --- | --- | --- |
|  | U/[V] | L/[rel. units] | U/[V] | L/[rel. units] |
| OLED from Example 3 | 3.57 | 1.83 | 4.25 | 1.63 |
| OLED from Comparison example 3.1 | 3.67 | 1.74 | 4.46 | 0.59 |

The voltage U and luminous intensity L, measured as photodiode current, at the start of the service life test (t=0), are compared with the corresponding values after 800 hours (t=800 hours) under a constant current load I=8 mA/cm$^2$.

A comparison of the two OLEDs shows that the OLED according to the invention from Example 3 with the hole-injecting layer containing the formulation according to the invention has a significantly longer service life in operation than the OLED from Comparison Example 3.1 with the hole-injecting layer of known material (PEDT-PSS).

Example 4

The formulation according to the invention from Example 2.1 is used to construct an organic light-emitting diode (OLED). In the production of the OLED the same procedure as in Example 3 is adopted, with the following difference in the process steps 1., 4. and 5.

Instead of ITO substrates coated over the whole surface (cf. Example 3, process step 1.), structured ITO substrates are used. The ITO structures consist of 2.0 mm wide strips insulated from one another. The structuring of the ITO was carried out by a conventional photoresist technique followed by etching in FeCl$_3$ solution.

Instead of using a perforated mask (cf. Example 3, process step 4) the metal cathode is vapour deposited through a strip mask that is aligned perpendicular to the ITO strips. The width of the strips is 2 mm. The active luminous area at the point of intersection of the two electrodes is 4 mm$^2$.

Instead of a constant current and operation with direct current (DC operation) (cf. Example 3, process step 5), a special alternating voltage is applied to the arrangements for the service life measurements. The frequency of the alternating voltage is 100 Hz. A constant current of 640 μA flows during the positive half-wave, whereas a voltage of −10 V is applied during the negative half-wave. The cycle ratio of positive to negative half-wave is 50:50. The integral area current density is 8 mA/cm$^2$.

Comparison Example 4.1

Production of an OLED with polyethylenedioxythiophene/polystyrenesulfonic acid as Hole-Injecting Layer:

The procedure is carried out as in Example 4, with the following variation in process step 2.:
2. Application of the Hole-Injection Layer About 10 ml of a 1.3% polyethylenedioxythiophene/polystyrenesulfonic acid solution (Baytron® P, TP AI 4083, weight ratio PEDT:PSS of 1:6; manufacturer H.C. Starck GmbH) are filtered (Millipore HV, 0.45 μm). The ITO-coated substrate is then placed on a paint application centrifuge and the filtered solution is distributed on the ITO-coated side of the substrate. The supernatant solution is then centrifuged off by rotating the plate at 1500 rpm for a period of 30 seconds. Following this the coated substrate is dried for 5 minutes at 200° C. on a hotplate. The layer thickness is 85 nm.

Comparison Example 4.2

Production of an OLED with polyethylenedioxythiophene/polystyrenesulfonic acid as hole-injecting layer:

The procedure is carried out as in Comparison Example 4.1, with the following variation in process step 2.:
2. Application of the Hole-Injection Layer About 10 ml of a 1.3% polyethylenedioxythiophene/polystyrenesulfonic acid solution (Baytron® P, TP AI 4083, weight ratio PEDT:PSS of 1:6; manufacturer H.C. Starck GmbH), which had also previously been desalted by column chromatography, are filtered (Millipore HV, 0.45 μm). The ITO-coated substrate is then placed on a paint application centrifuge and the filtered solution is distributed on the ITO-coated side of the substrate. The supernatant solution is then centrifuged off by rotating the plate at 1500 rpm for a period of 30 seconds. Following this the coated substrate is dried for 5 minutes at 200° C. on a hotplate. The layer thickness is 85 nm.

The application of the metal cathodes—according to process step 4—of the layer structures from Example 4, Comparison Examples 4.1 and 4.2, was carried out in a joint process step in order to ensure comparability.

Results of the characterision of the OLEDs from Example 4 and Comparison Examples 4.1 and 4.2:

|  | t = 0 | | t = 800 hours | |
| --- | --- | --- | --- | --- |
|  | U/[V] *) | L/[rel. units] | U/[V] *) | L/[rel. units] |
| OLED from Example 4 | 4.12 | 2.07 | 4.25 | 1.88 |
| OLED from Comparison example 4.1 | 4.11 | 1.45 | 4.74 | 0.36 |
| OLED from Comparison example 4.2 | 4.24 | 1.55 | 4.84 | 0.45 |

*) Measured during the positive half-wave

The EL arrangement according to the invention with the hole-injecting layer containing the formulation according to the invention (OLED from Example 4) proves to be more efficient also under pulsed electrical control and has a significantly longer service life than the EL arrangements with the hole-injecting layer of known material PEDT:PSS (OLEDs from Comparison Examples 4.1 and 4.2).

It is thus shown that the use of a formulation according to the invention as hole-injecting layer in the OLED according to the invention leads to a significantly longer service life of the OLEDs in operation compared to OLEDs that contain hole-injecting layers of known materials (PEDT:PSS).

Example 5.1

The formulation according to the invention from Example 2.1 is used to construct an organic light-emitting diode (OLED). In the production of the OLED the same procedure as in Example 3 is adopted.

Example 5.2

The formulation according to the invention from Example 2.2 is used to construct an organic light-emitting diode (OLED). In the production of the OLED the same procedure as in Example 5.1 is adopted, except that in process step 2 the formulation according to the invention from Example 2.2 is used.

Comparison Example 5.3

Production of an OLED with polyethylenedioxythiophene/polystyrenesulfonic acid (PEDT:PSS) as Hole-Injecting Layer:

The procedure is carried out as in Example 5.1, with the following variation in process step 2.:
2. Application of the Hole-Injection Layer About 10 ml of a 2.8% polyethylenedioxythiophene/polystyrenesulfonic acid solution (Baytron®P, TP CH8000, weight ratio PEDT:PSS 1:20; manufacturer H.C. Starck GmbH) are filtered (Millipore HV, 0.45 µm). The ITO-coated substrate is then placed on a paint application centrifuge and the filtered solution is distributed on the ITO-coated side of the substrate. The supernatant solution is then centrifuged off by rotating the plate at 1000 rpm for a period of 30 seconds. Following this the coated substrate is dried for 5 minutes at 200° C. on a hotplate. The layer thickness is 80 nm.

The application of the metal cathodes—according to process step 4—of the layer structures from Example 5.1, Example 5.2 and Comparison Example 5.3, was carried out in a joint process step in order to ensure comparability.

Results of the characterisation of the OLEDs from Examples 5.1 and 5.2 as well as Comparison Example 5.3:

|  | t = 0 | | t = 500 hours | |
|---|---|---|---|---|
|  | U/[V] | L/[rel. units] | U/[V] | L/[rel. units] |
| OLED from Example 5.1 | 3.49 | 1.57 | 4.20 | 1.41 |
| OLED from Example 5.2 | 3.58 | 1.72 | 4.59 | 1.19 |
| OLED from Comparison example 5.3 | 3.68 | 1.68 | 4.82 | 0.54 |

The voltage U and luminous intensity L, measured as photodiode current, at the start of the service life test (t=0), are compared with the corresponding values after 500 hours (t=500 hours) under a constant current load $I=8$ mA/cm$^2$.

The two OLEDs according to the invention from Examples 5.1 and 5.2 have longer service lives than the OLED from Comparison Example 5.3 with the known material PEDT:PSS in the hole-injecting layer. It is also shown that the use of the formulation according to the invention from Example 2.1 (weight ratio of PEDT:S to Nafion® of 1:6) for the production of a hole-injecting layer leads to even longer service lives of the resulting EL arrangement according to the invention in operation than when using the formulation according to the invention from Example 2.2 (weight ratio of PEDT:S to Nafion® of 1:2.5).

Example 6

The formulations according to the invention from Example 2.3 are used to construct organic light-emitting diodes (OLEDs). In the production of the OLEDs the same procedure as in Example 3 is adopted, with the following variation in process steps 1., 2. and 4.:

Instead of ITO substrates coated over the whole surface (cf. Example 3, process step 1.), structured ITO substrates are used. The ITO structures consist of 2.0 mm wide strips insulated from one another. The structuring of the ITO was carried out by a conventional photoresist technique followed by etching in FeCl$_3$ solution.

Instead of the solution from Example 2.1, in process step 2, Example 3, the solutions from Example 2.3 are used in each case.

Instead of using a perforated mask (cf. Example 3, process step 4) the metal cathode is vapour deposited through a strip mask that is aligned perpendicular to the ITO strips. The width of the strips is 1 mm. The active luminous area at the point of intersection of the two electrodes is 2 mm$^2$.

Comparison Example 6.1

The solution from Example 1 without addition of a further polymer is used to construct organic light-emitting diodes (OLEDs). For this, the solids content of the solution from Example 1 is increased to 5.12 wt. % by concentration by evaporation on a rotary evaporator (PEDT-S solution). In the production of the OLEDs the same procedure as in Example 6 is adopted, except that the PEDT-S solution is used in process step 2.

Results of the characterisation of the OLEDs from Example 6 and Comparison Example 6.1:

| Weight Ratio PEDT-S:PSS | Composition of the Solution for Process Step 2 | U = 8 V | |
|---|---|---|---|
| | | I [mA/cm$^2$] | L [rel. units] |
| only PEDT-S | PEDT-S solution with solids content (S.C.) 5.12% | 900 | 4.3 · 10$^{-6}$ |
| 1:1 | 21.1 g of PEDT-S solution with 1.45 wt. % S.C. 5.2 g of PSS solution with 5.88 wt. % S.C., | 900 | 8.0 · 10$^{-6}$ |
| 1:2.5 | 10.55 g of PEDT-S solution with 1.45 wt. % S.C., 6.37 g of PSS solution with 5.88 wt. % S.C. | 1000 | 5.0 · 10$^{-5}$ |
| 1:6 | 10.55 g of PEDT-S solution with 1.45 wt. % S.C., 15.61 g of PSS solution with 5.88 wt. % S.C. | 900 | 5.1 · 10$^{-5}$ |

The area current I and luminous intensity L of the arrangements are compared at U=8 V.

A comparison of the OLEDs from Example 6 and Comparison Example 6.1 shows that an OLED with a hole-injecting layer of pure PEDT-S has lower luminous densities at a comparable area current and thus a lower efficiency than OLEDs with a hole-injecting layer produced from the formulations according to the invention from Example 2.3. In addition the comparison shows that the efficiency can be significantly raised by increasing the weight ratio of PEDT-S:SS from 1:1 to 1:2.5 or 1:6.

Although the invention has been described in detail in the foregoing for the purpose of illustration, it is to be understood that such detail is solely for that purpose and that variations can be made therein by those skilled in the art-without departing from the spirit and scope of the invention except as it may be limited by the claims.

We claim:

1. A process for preparing a composition, said composition comprising:

(a) at least one polythiophene consisting of repeating units of the general formula (I-a), or of the general formula (I-b) or of the general formula (I-a) and (I-b)

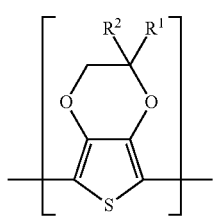

(I-a)

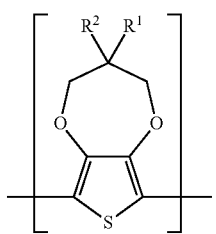

(I-b)

wherein,
R$^1$ denotes
—(CH$_2$)$_s$—O—(CH$_2$)$_p$—R$^3$,
where
R$^3$ denotes SO$_3^-$M$^+$ or COO$^-$M$^+$,
where M$^+$ denotes H$^+$, Li$^+$, Na$^+$, K$^+$, Rb$^+$, Cs$^+$ or NH$_4^+$,
s is an integer from 0 to 10,
p is an integer from 1 to 18,
R$^2$ independently of R$^1$ denotes a member selected from the group consisting of H, a linear or branched C$_1$-C$_{20}$-alkyl radical, a C$_6$-C$_{14}$-aryl radical, —(CH$_2$)$_s$—O—(CH$_2$)$_p$—R$^3$ and —(CH$_2$)$_q$—O—(CH$_2$CH$_2$O)$_r$R$^4$,
where R$^3$, s and p have the meanings given for R$^1$,
R$^4$ denotes C$_1$-C$_4$-alkyl,
q denotes an integer from 0 to 10, and
r denotes an integer from 1 to 12,
and (b) at least one further polymer, that is different than said polythiophene (a) wherein said further polymer represents (i) a partially fluorinated or perfluorinated polymer comprising SO$_3^-$M$^+$ groups or (ii) a partially fluorinated or perfluorinated polymer comprising COO$^-$M$^+$ groups or (iii) a salt of (i) or (ii), in which M$^+$ in each case denotes a member selected independently from the group consisting of H$^+$, Na$^+$, K$^+$, Rb$^+$, Cs$^+$ or NH$_4^+$ wherein said process comprises
mixing the at least one polythiophene with the at least one further polymer and optionally adding at least one solvent to this mixture; or
dissolving the at least one polythiophene in at least one diluent and dissolving the at least one further polymer in at least one diluent and mixing these two solutions; or
producing the at least one polythiophene by polymerisation of the corresponding monomeric compounds with at least one suitable oxidising agent in at least one suitable solvent, wherein an exchange of solvent or addition of further solvents may take place after completion of the polymerisation, and mixing the polythiophene solution with the at least one further polymer, the further polymer optionally being dissolved in at least one diluent.

2. The process of claim 1 wherein,
M$^+$ in each case denotes a member selected independently from the group consisting of H$^+$, Na$^+$ and K$^+$, and
s is an integer from 0 to 3.

3. The process of claim 1 wherein
M$^+$ denotes H$^+$, and
s denotes 0 or 1.

4. The process of claim 1 wherein R$^2$ denotes H.

5. The process of claim 1 wherein said further polymer (b) is a copolymer of tetrafluoroethylene and of the fluorovinylether of poly(hexafluoropropylene oxide)mono(tetrafluoro vinyl sulfonic acid)-ethers or salt thereof.

6. The process claim 1, wherein said composition comprises at least two further polymers (b).

7. The process of claim 6 wherein said two polymers are polystyrene sulfonic acid and a copolymer of tetrafluoroethylene and of the fluorovinylether of poly(hexaflouoropropylene oxide)mono(tetrafluoro vinyl sulfonic acid)ethers and their respective salts.

8. The process of claim 1 wherein said composition has a weight ratio of said polythiophene (a) to said further polymer (b) of 1:2 to 1:15.

9. The process of claim 1 wherein said composition further comprises at least one polar diluent.

10. The process of claim 9 wherein said polar diluent is selected from the group consisting of water, alcohols and mixtures thereof.

11. The process of claim 9 wherein said polar diluent is selected from the group consisting of water, methanol, ethanol, n-propanol, 2-propanol, n-butanol and mixtures thereof.

* * * * *